United States Patent
Lam et al.

(10) Patent No.: US 8,737,121 B2
(45) Date of Patent: May 27, 2014

(54) DRIFT-INSENSITIVE OR INVARIANT MATERIAL FOR PHASE CHANGE MEMORY

(75) Inventors: Chung H. Lam, Peekskill, NY (US); Jing Li, Ossining, NY (US); Binquan Luan, Pleasantville, NY (US); Glenn J. Martyna, Croton on Hudson, NY (US); Dennis M. Newns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/478,932

(22) Filed: May 23, 2012

(65) Prior Publication Data

US 2013/0314983 A1    Nov. 28, 2013

(51) Int. Cl.
*G11C 13/00* (2006.01)
*G11C 11/16* (2006.01)

(52) U.S. Cl.
CPC ............ *G11C 11/16* (2013.01); *G11C 13/0004* (2013.01)
USPC .......................................... 365/163; 365/158

(58) Field of Classification Search
CPC ............................. G11C 11/16; G11C 13/0004
USPC .................................................. 365/158, 163
See application file for complete search history.

(56) References Cited

U.S. PATENT DOCUMENTS

| | | | |
|---|---|---|---|
| 6,914,801 B2 | 7/2005 | Kostylev et al. | |
| 7,701,749 B2 | 4/2010 | Jeong et al. | |
| 7,929,338 B2 | 4/2011 | Franceschini et al. | |
| 7,936,593 B2 | 5/2011 | Savransky | |
| 7,944,740 B2 | 5/2011 | Lam et al. | |
| 8,384,060 B2 * | 2/2013 | Ryoo et al. | 257/4 |
| 8,415,197 B2 * | 4/2013 | Choi et al. | 438/102 |
| 2011/0038216 A1 | 2/2011 | Chen | |

OTHER PUBLICATIONS

J. Li, et al., "Explore Physical Origins of Resistance Drift in Phase Change Memory and Its Implication for Drift-Intensive Materials," 2011 IEEE International Electron Devices Meeting (IEDM), Dec. 5-7, pp. 12.5.1-12.5.4.
G.W. Burr, et al., "Phase Change Memory Technology," Journal of Vacuum Science & Technology B, vol. 28, Issue 2, 210, pp. 223-262, Mar. 29, 2010.
H.Y. Cheng, et al., "A High Performance Phase Change Memory with Fast Switching Speed and High Temperature Retention by Engineering the GexSbyTez Phase Change Material," IEEE 2011; pp. 3.4.1-3.4.4.
G.W. Burr, et al., "The Inner Workings of Phase Change Memory: Lessons From Prototype PCM Devices," IEEE Globecom 2010 Workshop on Application of Communication Theory to Emerging Memory Technologies; pp. 1890-1894.
M. Mitra, et al., "Extremely Low Drift of Resistance and Threshold Voltage in Amorphous Phase Change Nanowire Devices," Applied Physics Letters, vol. 96, Issue 22, 222111, 3 pages, Jun. 4, 2010.

* cited by examiner

*Primary Examiner* — Michael Tran
(74) *Attorney, Agent, or Firm* — Cantor Colburn LLP; Vazken Alexanian

(57) ABSTRACT

A method of storing a bit at a memory device is disclosed. A memory cell the memory device is formed of a germanium-deficient chalcogenide glass configured to alternate between an amorphous phase and a crystalline phase upon application of a selected voltage, wherein a drift coefficient of the germanium-deficient chalcogenide glass is less than a drift coefficient of an undoped chalcogenide glass. A voltage is applied to the formed memory cell to select one of the amorphous phase and the crystalline phase to store the bit.

18 Claims, 5 Drawing Sheets

US 8,737,121 B2

DRIFT-INSENSITIVE OR INVARIANT MATERIAL FOR PHASE CHANGE MEMORY

BACKGROUND

The present invention relates generally to materials used in phase change memory, and more specifically, to methods of reducing a resistivity drift in phase change memory material.

The dimension of a memory cell holding binary-digit (bit) information has been decreased dramatically and is approaching the limits of lithography capability. To further increase data density, phase change materials (PCM) have been proposed to hold multi-bit information in one memory cell. Among many PCMs, chalcogenide $Ge_2Sb_2Te_5$ (GST) has been studied because of its fast and reversible transition between crystalline and amorphous phases in which resistances of GST differ by about three orders of magnitude. Although programmed resistances of an amorphous GST in a memory cell are initially well separated, the resistivity of an amorphous GST increases with time according to a power law. This resistivity drift makes it difficult to retrieve information stored according to cell resistivity.

SUMMARY

According to one embodiment, a method of storing a bit at a memory device includes: forming a memory cell of a germanium-deficient chalcogenide glass configured to alternate between an amorphous phase and a crystalline phase upon application of a selected voltage, wherein a drift coefficient of the germanium-deficient chalcogenide glass is less than a drift coefficient of an undoped chalcogenide glass; and applying a voltage to the formed memory cell to select one of the amorphous phase and the crystalline phase to store the bit.

According to another embodiment, a method of reducing a resistivity drift of a phase change memory cell includes: forming the phase change memory cell using a germanium-antimony-tellurium (GST) compound, wherein the GST compound is germanium-deficient with respect to a related undoped GST compound, and wherein the resistivity drift is directly related to an amount of germanium deficiency of the GST compound.

According to another embodiment, a method of storing multiple bits at a memory cell includes: forming a memory cell of a germanium-deficient chalcogenide glass configured to select one of a plurality of conductive states upon application of a selected voltage, wherein a drift coefficient of the germanium-deficient chalcogenide glass is less than a drift coefficient of an undoped chalcogenide glass; and applying the selected voltage to select the one of the plurality of conductive states to store the multiple bits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Phase change memory is a technology for storing digital bit data using a phase change material (PCM) that may be made to exist in at least one of two phases: a crystalline phase and an amorphous phase. The resistance of the amorphous phase differs from the resistance of the crystalline phase by about three orders of magnitude. Due to this difference, as well as the relative speed in which the material changes phases (i.e., <100 nanoseconds), these materials may be used to store digital information (bits). While the resistance of the crystalline phase is generally stable, the resistance of the amorphous phase is susceptible to resistivity drift, in which the resistivity of the phase changes over time. This resistivity drift may reduce the effectiveness of the material for use in phase change memory. This present disclosure provides a method of reducing resistance drift that commonly occurs in phase change materials containing germanium, antimony and tellurium atoms (i.e., GST compounds). Germanium atoms play a role in the resistivity drift. By forming the phase change memory using germanium-deficient GST material, resistance drift is suppressed.

Figure 1:
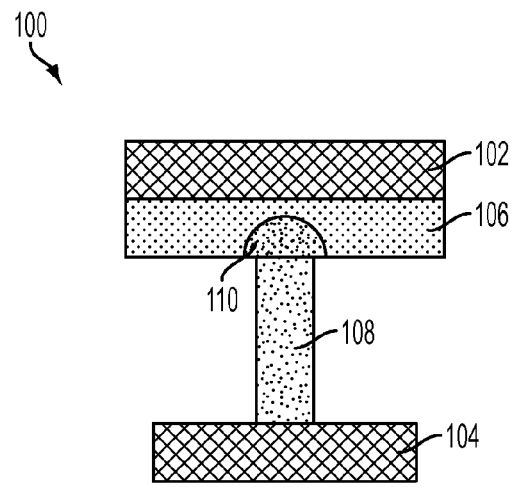
FIG. 1 shows an exemplary memory cell of a phase change memory that uses an exemplary phase change material of the disclosure.

FIG. 1 shows an exemplary memory cell 100 of a phase change memory that uses an exemplary phase change material of the present disclosure. The exemplary memory cell 100 is generally referred to as a mushroom cell and includes a top electrode 102 and a bottom electrode 104. The top electrode 102 is coupled to the exemplary phase change material 106 at one end thereof. A resistor member 108 connects the bottom electrode 104 to the exemplary phase change material 106 at an opposing end to provide an electrical connection that provides an active region 110. The exemplary phase change material 106 of the disclosure is generally a germanium-deficient chalcogenide glass such as germanium-antimony-tellurium (GST) ternary compounds. In an exemplary embodiment, the exemplary phase change material 106 is a germanium-deficient GST compound. The exemplary phase change material 106 may exist in either a crystalline phase or an amorphous phase. The crystalline phase generally exhibits a low resistance to current, while the amorphous phase exhibits a comparatively high resistance. Applying a selected voltage across the top electrode 102 and the bottom electrode 104 changes the exemplary phase change material 106 in the active region 110 back and forth between crystalline and amorphous phases, thereby selecting a bit storage state. In various aspect, the exemplary memory cell 100 may be used to store multiple bits, as discussed below with respect to FIG. 3.

Figure 2:
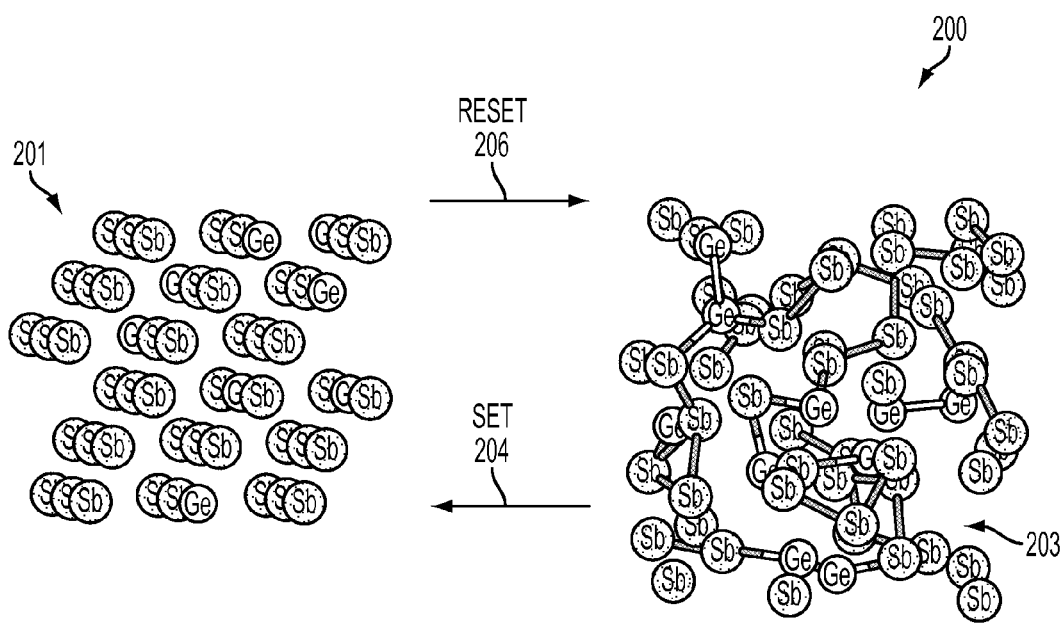
FIG. 2 shows a phase change cycle for the exemplary phase change material.

FIG. 2 shows a phase change cycle 200 for the exemplary phase change material of the present disclosure. The exemplary phase change material 106 may be a germanium-antimony-tellurium (GST) ternary compound that is germanium-deficient. For example, the compound may be a germanium-deficient GST compound related to an undoped GST compound. For example, the compound may be a GST ternary compound that has less than about 20% of the germanium present in the related undoped GST ternary compound. In one example, the germanium-deficient compound has less than about 20% of the germanium present in undoped $Ge_2Sb_2Te_5$. In an exemplary embodiment, the chemical formula of the germanium-deficient GST compound is $Ge_1Sb_3Te_5$. To change the exemplary germanium-deficient GST compound from its amorphous phase 203 into its crystallization phase 201, a SET voltage pulse 204 is applied to heat the amorphous phase 201 above a crystallization temperature. The SET pulse 204 may be about 10 nanoseconds in duration in several embodiments in order to allow the atoms to settle into a crystalline structure. To change from the crystalline phase 201 to the amorphous phase 203, a RESET voltage pulse 206 is applied to heat the amorphous phase above a melting temperature. The peak voltage of the RESET pulse 206 is generally higher than the peak voltage of the SET pulse 204. The RESET pulse 206 is also generally of shorter duration than the SET pulse 204. The RESET pulse 206 is ended abruptly, forcing the phase change material to quench into the amorphous phase 203. In this manner, an operator may store a digital bit at the memory cell using the SET pulse 204 and RESET pulse 206. Reading the memory cell generally involves applying a low voltage to the selected phase to determine the resistance of the cell, wherein the low voltage does not affect the phase or atomic structure of the germanium-deficient GST compound.

Figure 3:
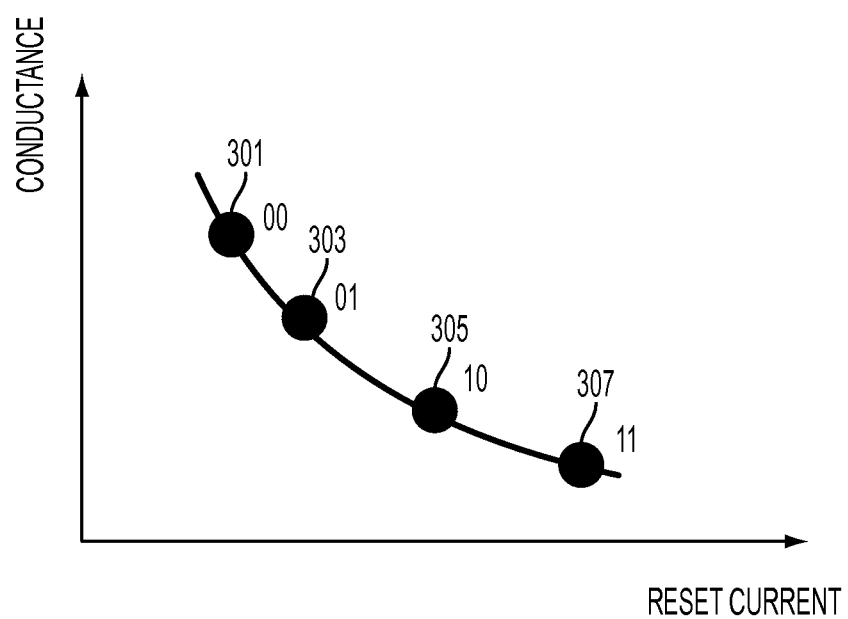
FIG. 3 shows various stable conductive levels that may be obtained using the exemplary germanium-deficient phase change material.

FIG. 3 shows various stable conductive levels that may be obtained using the exemplary germanium-deficient phase change material 106. Due to the number of conductivity states, the exemplary germanium-deficient GST compound may be used to store multiple bits at a time. For example, '00' may be assigned a highest conductive state 301, '01' may be assigned a next highest conductive state 303, '10' may be assigned to the next conductive state 305, and '11' may be assigned to the lowest conductive state 307. A selected reset current may be used to select the conductance state. In order to maintain a bit state, the conductivity or alternately the resistivity is held substantially constant over an expected bit storage lifetime. The resistivity of the amorphous phase is generally related to an atomic configure of the germanium atoms, as discussed below.

Figure 4:
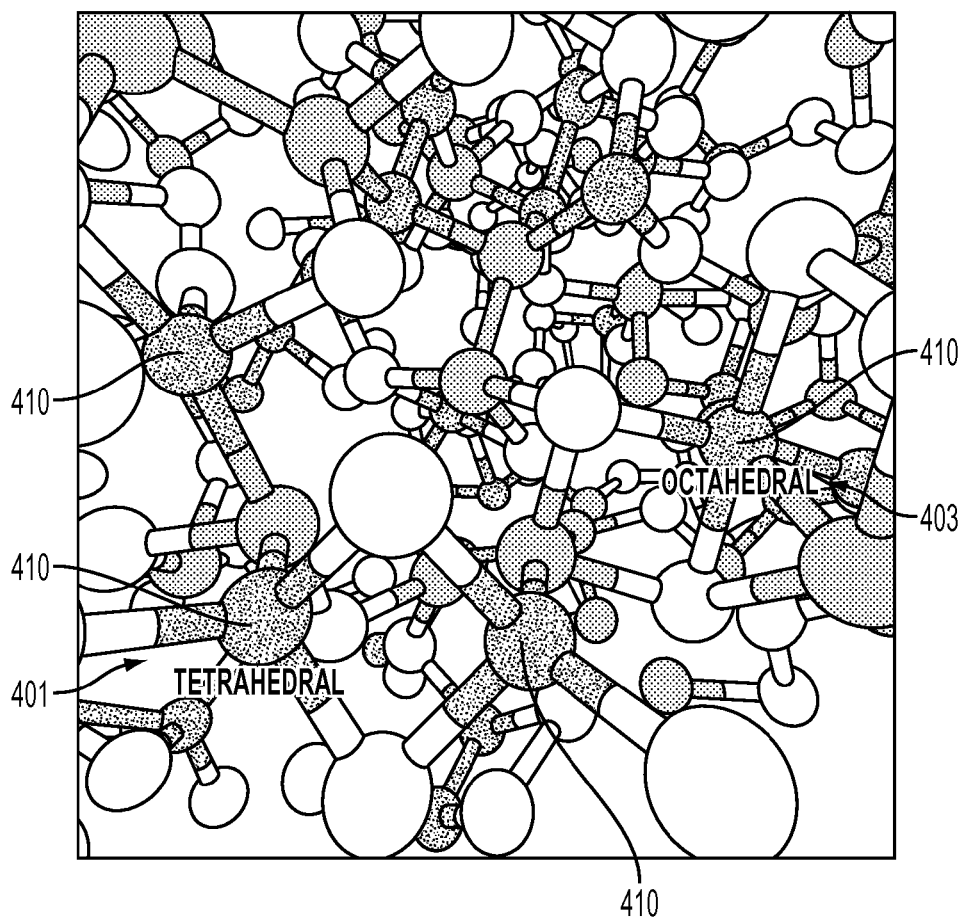
FIG. 4 shows an exemplary atomic configuration of the amorphous phase of an exemplary phase change material of the disclosure.

FIG. 4 shows an exemplary atomic configuration of the amorphous phase 203 of the exemplary germanium-deficient GST compound. In the amorphous phase 203, the germanium atoms 410 generally configure themselves into one of two atomic coordinations: either a tetrahedral coordination 401 or an octahedral coordination 403. In a tetrahedral coordination 401, the germanium atom 410 is surrounded by four atoms, generally in a tetrahedral configuration centered on the germanium atom 410. In an octahedral coordination 403, the germanium atom 410 is surrounded by eight atoms, generally in an octahedral configuration centered on the germanium atom 410. In general, the resistivity of the GST compound increases as the number of tetrahedral coordinations 403 increases. Additionally, repeated quenching produces more and more germanium atoms in the tetrahedral coordination.

Figure 5:
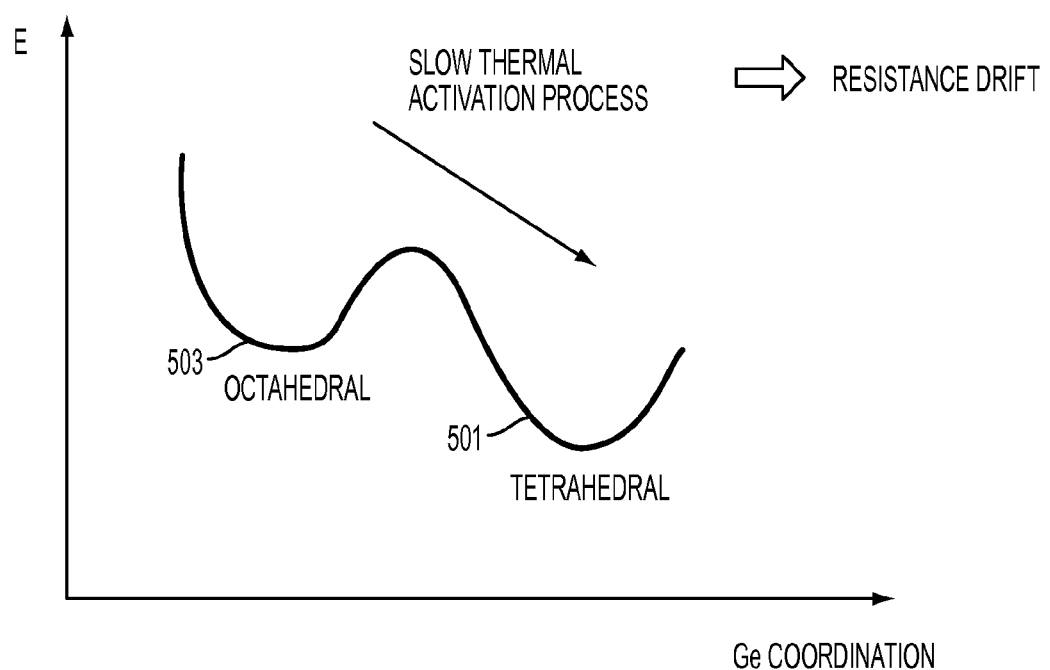
FIG. 5 shows an exemplary energy landscape illustrating relative energies for a various germanium coordinations.

FIG. 5 shows an exemplary energy landscape illustrating relative energies for a tetrahedral germanium coordination 401 and an octahedral germanium coordination 403. The octahedral coordination 401 occurs at a higher energy level 503 than does the tetrahedral coordination 501. Therefore, the tetrahedral coordination 401 is a stable state and the octahedral coordination 403 is a metastable state. Due to thermal activity and other processes, the germanium atoms 410 may be moved out of its metastable state and resettle in the stable state, therefore rearranging from the octahedral coordination 403 to the tetrahedral coordination 401 over time. The tetrahedral coordination 401 is more resistive to current flow than the octahedral coordination 403. Since the number of tetrahedral coordinations 401 generally increases over time, the resistance of the amorphous material increases over time in a process known as resistivity drift. The resistance drift is generally given by Equation 1:

$$R(t) = R_0 t^n \quad \text{Eq. (1)}$$

wherein R(t) is the resistivity at time t, $R_0$ is the original resistivity of the material when it is set into its amorphous state, t is time and n is a resistivity drift coefficient.

In general, a number of defect states in an energy gap above a Fermi energy of the amorphous phase decreases when more and more germanium atoms adopt the tetrahedral coordination. The electric conductance of GST compound decreases (resistance increase) when the gap is wider or the number of defect states in the gap decreases. Therefore, as the germanium coordinations rearrange over time, the electric resistance of the GST compound gradually increases, i.e., resistance drift. Thus, a germanium-deficient GST compound exhibits less resistance drift than an undoped GST material.

The qualitative relation for resistivity drift between the atomic structure relaxation and the change of electronic gap-states be quantified using an order function. For each local atomic structure formed by the $i^{th}$ atom and its nearest neighbors, the order function is defined by Eq. (2):

$$q_i = \prod_{j,k=1}^{n_i} |\sin(\theta_{j2k} - \theta_\tau)|^{\frac{1}{n_i(n_i+1)}} \quad \text{Eq. (2)}$$

$$F(Q) = \langle q \rangle = \sum_i q_i / N \quad \text{Eq. (3)}$$

wherein $n_i$ is the number of nearest neighbors of the $i^{th}$ atom, $\theta_{ijk}$ (j≠k) is an angle between any two bonds centered at the $i^{th}$ atom, $\theta_i^T$ is a target angle. In various embodiments, target angle $\theta_i^T$ is about 90 degrees. In Eq. (3), F(Q) is the average value of $q_i$ over all atoms of the same type can be used to quantitatively evaluate drift contributed by each elemental material component. The smaller the F(Q), the less gap sites and hence less drift. Thus, reducing germanium reduces the number of tetrahedral coordination, consequently leading to lower F(Q) and hence to less resistivity drift.

Figure 6:
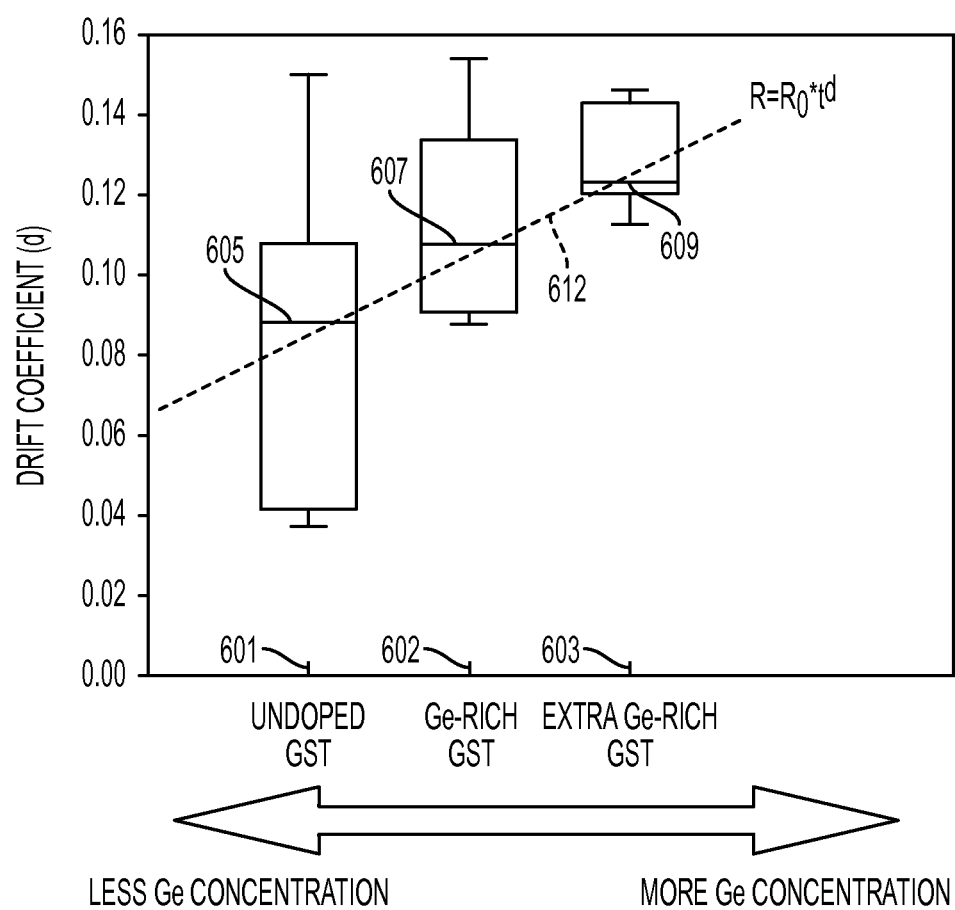
FIG. 6 shows a relation between resistivity drift coefficient and germanium content in a GST compound.

The exemplary germanium-deficient GST compound of the disclosure reduces the number of tetrahedral coordinations in the amorphous in comparison with its related, undoped GST compound. Reducing the number of germanium atoms forces the germanium atoms to adopt the octahedral phase over the tetrahedral phase, thereby contributing to lower resistivity drift, as shown in FIG. 6. The germanium-deficient GST may increase a lifetime of the amorphous state thereby increase the time for which digital information of a bit or multiple bits may be stored.

FIG. 6 shows a relation between the resistivity drift coefficient ('n') and germanium content in a GST compound. Drift coefficient is shown for an undoped GST 601, such as $Ge_2Sb_2Te_5$, a Ge-rich GST 603 and an extra Ge-rich GST 605. For undoped GST 601, a mean value 605 of the drift coefficient is about 0.09. For Ge-rich GST 602, the mean value 607 of the drift coefficient is about 0.105. For extra Ge-rich GST 603, the mean value 609 of the drift coefficient is about 0.12. A trend line 612 of the mean values of the drift coefficient is shown. The trend line shows that decreasing the germanium concentration reduces the drift coefficient. Therefore, the resistance drift of the exemplary germanium-deficient GST compound of the disclosure is less than the resistance drift of the undoped GST 601.

In one embodiment, the phase change material of the memory cell 100 is made of an exemplary germanium-deficient GST compound discussed herein. An operator may select a drift coefficient and determine using the trend line 612 a value for x that yields a germanium-deficient GST compound having a selected drift coefficient.

An exemplary memory of the disclosure includes a memory cell composed of a germanium-deficient chalcogenide glass, such as a germanium-deficient GST compound that may be operated to switch between an amorphous phase and a crystalline phase upon application of a selected voltage, wherein a drift coefficient of the germanium-deficient chalcogenide glass is less than a drift coefficient of a related undoped chalcogenide glass. The memory cell may be used to store multiple bits at one time. Also, a transition speed between the phases of the germanium-deficient chalcogenide glass is generally greater than a transition speed of the related undoped chalcogenide glass. The transition speed is generally controlled by the number of tetrahedral coordinations of germanium atoms, since tetrahedral coordinations of germanium atoms inhibit or prevent crystallization locally. Thus, reducing the number of tetrahedral coordination by reducing germanium content increases the transition speed.

FIG. 7 shows an exemplary flow chart 700 describing a method of forming the exemplary memory cell disclosed herein. In box 701 a top electrode and a bottom electrode are provided. In box 702, a germanium-deficient GST compound is formed in an active layer. The active layer of the germanium-deficient GST compound may be formed using various sputtering techniques. The active layer may be fabricated either on the top electrode or separate from the top electrode and then brought into electrical connection with the top electrode. The active layer of the device is deposited by co-sputtering of a $Ge_2Sb_2Te_5$ alloy target and an elemental germanium target used in physical vapor deposition. The concentration of the germanium element may be varied by applying different DC sputtering power to the germanium gun while the DC power to the $Ge_2Sb_2Te_5$ is kept constant. In box 703, the bottom electrode into an electrical connection with active layer using the resistive member. The resulting PCM cell is resistant to resistivity drift in comparison to a PCM cell using an active layer formed of undoped GST compound. The resistivity drift is directly related to an amount of germanium deficiency of the GST compound.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comp rises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of storing a bit at a memory device, comprising:
   configuring a memory cell comprising a germanium-deficient chalcogenide glass to alternate between an amorphous phase and a crystalline phase upon application of a selected voltage, wherein a resistivity drift coefficient of the germanium-deficient chalcogenide glass is less than a resistivity drift coefficient of an undoped chalcogenide glass, wherein the resistivity drift coefficient is related to a number of tetrahedral germanium coordinations in the amorphous phase of the chalcogenide glass and the memory cell is configured to have a fewer tetrahedral germanium coordinations in the amorphous phase than the undoped chalcogenide glass; and
   applying a voltage to the formed memory cell to select one of the amorphous phase and the crystalline phase to store the bit.

2. The method of claim 1, wherein the undoped chalcogenide glass is a compound selected from the group consisting of: (i) a GeSbTe ternary compound; (ii) $Ge_2Sb_2Te_5$.

3. The method of claim 1, wherein the germanium-deficient chalcogenide glass has less than about 20% the amount of germanium present in undoped $Ge_2Sb_2Te_5$.

4. The method of claim 1, wherein the germanium-deficient chalcogenide glass has a chemical formula that is substantially $Ge_1Sb_3Te_5$.

5. The method of claim 1, further comprising applying a voltage selected to provide storage of multiple bits by the memory cell.

6. The method of claim 1, further comprising operating the memory cell at a transition speed that is greater than a transition speed of the related undoped chalcogenide glass.

7. A method of forming a phase change memory cell having a reduced resistivity drift, the method comprising:
   forming a bottom electrode;
   forming a top electrode;
   forming a phase change material (PCM) in contact with one of the top and bottom electrodes; and
   forming a resistor in contact with the PCM and the top and bottom electrodes, wherein the PCM comprises a germanium-antimony-tellurium (GST) compound that is germanium-deficient with respect to a related undoped GST compound and has fewer tetrahedral germanium coordinations in an amorphous phase than the related undoped GST, wherein the resistivity drift is directly related to an amount of germanium deficiency of the germanium-deficient GST compound and is related to a number of tetrahedral germanium coordinations in the amorphous phase of the GST compound.

8. The method of claim 7, wherein the resistivity drift is characterized by a resistivity drift coefficient and the resistivity drift coefficient is directly related to the amount of germanium deficiency of the GST compound.

9. The method of claim 8, further comprising determining a trend of the resistivity drift coefficient with respect to germanium abundance in the GST compound, selecting a resistivity drift coefficient, selecting a germanium deficiency from the selected resistivity drift coefficient and the determined trend line, and forming the phase change memory cell of a GST compound having the selected germanium deficiency.

10. The method of claim 7, wherein a germanium-deficient GST compound is related to an undoped GST compound selected from the group consisting of: (i) a GeSbTe ternary compound; (ii) $Ge_2Sb_2Te_5$.

11. The method of claim 7, further comprising forming the germanium-deficient GST compound to have has less than about 20% the amount of germanium present in undoped $Ge_2Sb_2Te_5$.

12. The method of claim 1, further comprising forming the germanium-deficient GST compound to have a chemical formula of $Ge_1Sb_3Te_5$.

13. A method of storing multiple bits at a memory cell, comprising:

configuring a memory cell comprising a germanium-deficient chalcogenide glass to select one of a plurality of conductive states upon application of a selected voltage, wherein a resistivity drift coefficient of the germanium-deficient chalcogenide glass is less than a resistivity drift coefficient of an undoped chalcogenide glass, wherein the resistivity drift coefficient is related to a number of tetrahedral germanium coordinations in the amorphous phase of the chalcogenide glass, further comprising forming the memory cell to have a fewer tetrahedral germanium coordinations in the amorphous phase than the undoped chalcogenide glass; and applying the selected voltage to select the one of the plurality of conductive states to store the multiple bits.

14. The method of claim 13, wherein the multiple conductive states further comprises at least four conductive states.

15. The method of claim 13, wherein the germanium-deficient chalcogenide glass is related to an undoped chalcogenide glass that is selected from the group consisting of: (i) a GeSbTe ternary compound; (ii) $Ge_2Sb_2Te_5$.

16. The method of claim 13, wherein the germanium-deficient chalcogenide glass has less than about 20% the amount of germanium present in undoped $Ge_2Sb_2Te_5$.

17. The method of claim 13, wherein the germanium-deficient chalcogenide glass has a chemical formula that is substantially $Ge_1Sb_3Te_5$.

18. The method of claim 13, further comprising operating the memory cell at a transition speed that is greater than a transition speed of the related undoped chalcogenide glass.

* * * * *